Dec. 31, 1968 L. LUCAS 3,419,762

HIGH-VOLTAGE SEMICONDUCTOR DIODE WITH CERAMIC ENVELOPE

Filed March 18, 1966 Sheet 1 of 3

INVENTOR.
LOUIS LUCAS
BY
[signature]
AGENT

INVENTOR.
LOUIS LUCAS
BY
[signature]
AGENT

INVENTOR.
LOUIS LUCAS
BY
Frank R. Trifari
AGENT

United States Patent Office 3,419,762
Patented Dec. 31, 1968

3,419,762
HIGH-VOLTAGE SEMICONDUCTOR DIODE WITH CERAMIC ENVELOPE

Louis Lucas, Calvados, France, assignor to North American Philips Company, Inc., New York, N.Y., a corporation of Delaware
Filed Mar. 18, 1966, Ser. No. 535,374
Claims priority, application France, Mar. 20, 1965, 10,078
4 Claims. (Cl. 317—234)

ABSTRACT OF THE DISCLOSURE

A high-voltage semiconductor diode having a hermetically-sealed ceramic envelope with leads at opposite ends. A semiconductor crystal is secured to one lead, and the other lead is secured to the envelope. A curved, resilient plate provides a good contact between the crystal and the other lead. An insulating bead secures the one lead to the envelope providing good heat insulation for the crystal while the bead is bonded to the envelope.

Figure 1:
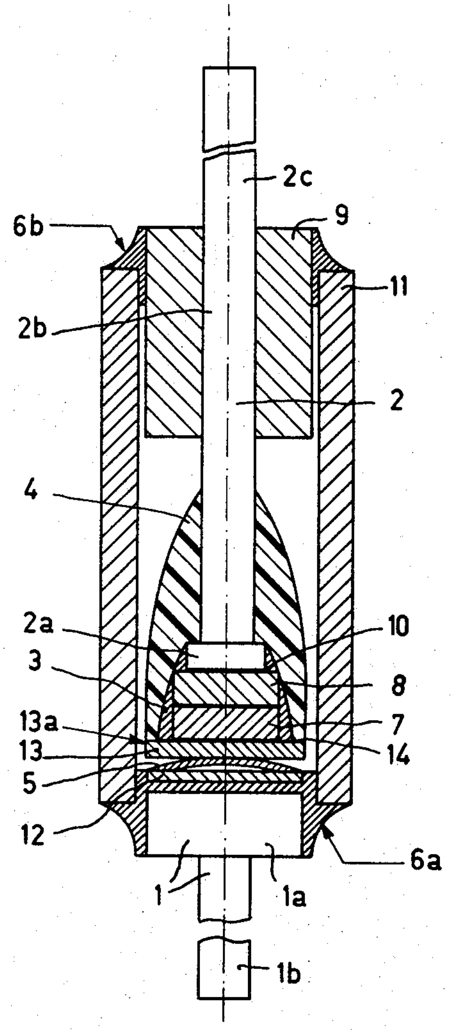

As is known, semiconductor devices for high voltage, particularly silicon diodes, must be arranged in a hermetically sealed envelope so that the electrodes are very readily insulated from one another.

This envelope generally has an elongated shape, usually the shape of a straight circular cylinder, each of the end walls being traversed by a connection conductor which is connected to one of the electrodes. As insulating material may be used a ceramic material, for example, steatite. The cylindrical part of the envelope often consists of ceramic material, while the end walls of the cylinder are manufactured from metal or from insulating material having a metal lead-in member.

Soldering such a ceramic cylinder to the metal components often encounters difficulties while, in general, it is even impossible to solder said materials together as such. A thin intermediate layer of metal or an alloy has to be provided on the ceramic material and this material is heated, during soldering, to a temperature of the order of 200° C.

In some cases the junctions in silicon semiconductor devices cannot withstand temperatures of, for example, more than 180° C.

To avoid damage to the said junctions it must consequently be ensured that during soldering the ceramic material to the metal the semiconductor junction does not reach the temperature required for soldering. In addition the device must be capable of withstanding the unavoidable temperature fluctuations occurring during soldering without harmful mechanical stresses arising.

The invention mitigates the said drawbacks.

The semiconductor device according to the invention which in known manner comprises an envelope which envelops the active semi-conductor elements of the device in the walls of which envelope at least one aperture is provided through which at least one of the connection conductors which is connected to an electrode and, at one of its ends, supports the said active semiconductor elements, extends in the said aperture of the envelope and is secured to the said envelope is characterized in that a bead of insulating material is secured to the connection conductor in question, at least through a part of its length, the bead itself being secured in the wall of the aperture of the envelope, and further flexibly stressed contact means are arranged between the said active elements on one side and the connection conductors connected to other electrodes of the device on the other side, on which pressure being exerted on the said contact means by the said active elements.

In this manner it is possible to manufacture the device according to the invention by assembling pre-fabricated units. The first of these units may consist of the envelope which, in devices for high voltage, may advantageously consist of ceramic material and to which the traversing connection conductors of the other electrodes are secured by soldering. The second unit consists of the connection conductor which supports the active elements and to which the ceramic bead is soldered before said elements are secured to it. After the flexible means have been provided in place the second unit can be inserted into the first unit through the said aperture after which the active elements are forced against the flexible means, the ceramic bead being soldered to the envelope and forming a hermetic seal of the envelope.

So the ceramic bead is soldered to the connection conductor before the active elements are secured to it so that the said elements cannot be damaged during soldering. In addition, the soldering joint between the bead and the envelope may be effected without danger for the active elements in that the ceramic bead and the length of the connection conductors supporting the said elements ensure a ready heat insulation between the elements and the soldering zone. To improve the heat insulation the ceramic bead has a height in the direction of the conductor which is larger than the transverse dimension. The presence of the flexible means on the one hand ensures a satisfactory electrical contact with the active element and on the other hand permits the mechanical expansion of certain components without harmful results to the assembly.

In American patent specification 2,853,661 and Belgian patent specification 601,204 a pre-mounting in the mounting of a semiconductor diode is described of a unit which comprises the active elements and a connection member. However, the said unit comprises neither a ceramic bead, which serves as a heat insulator in the hermetic sealing, nor flexible means. The device according to the invention has the particular advantage that the heat insulation by the bead permits the use of an envelope of ceramic material the thermal mechanical and dielectric properties of which are particularly interesting for the anticipated use.

An even better protection is obtained by coating the active elements and the adjacent parts of the crystal support with a lacquer on the basis of silicones on which a flexible polymerisable synthetic material is provided.

Figure 2:
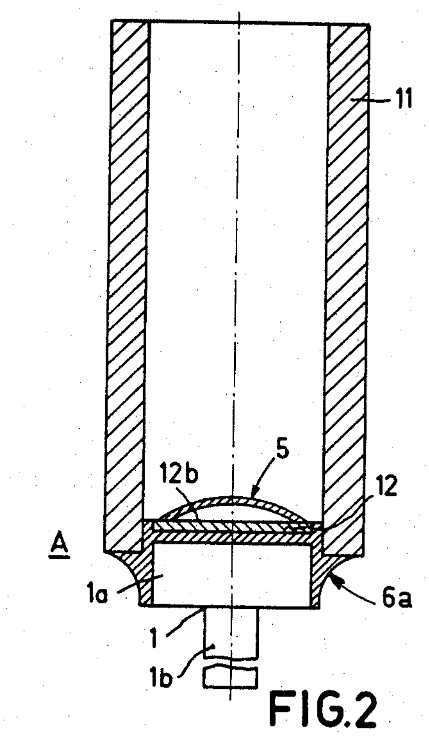
Figure 3:
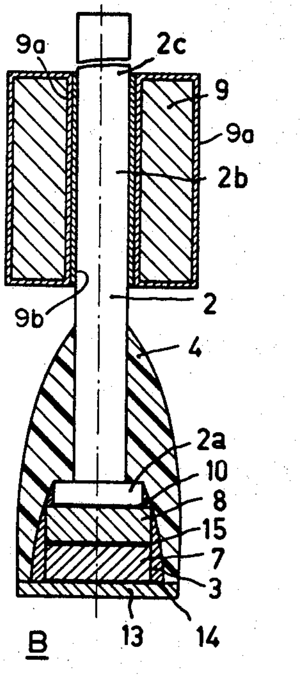

In order that the invention may be readily carried into effect it will be described in greater detail, by way of example, with reference to the accompanying drawing, in which FIGURE 1 is a longitudinal section showing a diode FIGURES 2 and 3 are longitudinal sections showing the units from which the diode shown in FIGURE 1 is composed.

Figure 4:
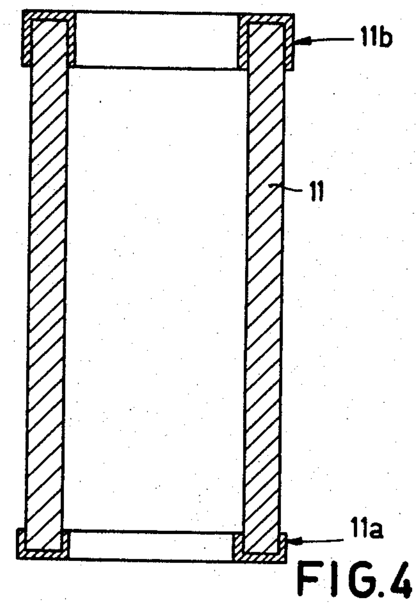
Figure 5:
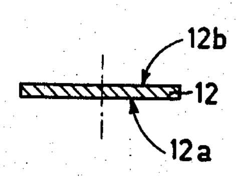

FIGURES 4, 5 and *6a*–*6c* respectively show the ceramic cylindrical envelope, a flat wafer to support a flexible contact member and the said flexible member as used in the manufacture of the diode shown in FIGURE 1. for high voltage according to the invention.

The unit A shown in FIGURE 2 consists of a ceramic cylinder 11 which forms the greater part of the envelope of the diode (FIGURE 1) and which ensures the mechanical rigidity thereof.

As the material for the said envelope has been chosen a ceramic material on the basis of its better thermomechanical and dielectrical properties instead of glass or a synthetic material.

At one end the cylinder 11 is closed by a metal stopper 1 which consists of a plate 1*a* which forms one of the end walls of the cylindrical envelope, and a connection conductor 1$b$. Since the stopper 1 is rigidly secured to the cylinder 11 by means of a soldering joint 6$a$ it must consist of such a metal or such an alloy that the assembly of the cylinder and the stopper can withstand thermal shocks which do occur not only in soldering but also during operation. The properties of expansion of the components of such constructions are known to those skilled in the art.

A flat wafer 12 which is soldered to the plate 1$a$ on the side remote from the connection conductor renders it possible to obtain a flat surface on which a flexible member 5 bears which is capable of performing a free deformation. It is noted that the said flexible member actually forms no part of the unit A since it is not rigidly secured to it but is simply laid on the wafer 12 immediately before the two units of the diode are combined to form one assembly after which the flexible member is held in its place by the pressure obtained during assembling.

The unit B shown in FIGURE 3 comprises a crystal support 2, which consists of a wafer 2$a$ to which the active semiconductor element(s) can be secured by any of the known methods, and a wire-shaped or rod-shaped member 2$b$ which has a length such that one end 2$c$ thereof may serve as a connection member or lead-in conductor of the ultimate semiconductor device.

In FIGURE 3 active semiconductor elements 7 and 8, soldered together at 15, are arranged between the wafer 2$a$ to which they are secured by solder 10 and a contact plate 13 to which they are secured by solder 14. The plate 13 has a larger surface than the elements 7 and 8 so that its projecting part may serve as a support for a protecting lacquer layer 3, which surrounds the active elements, and for a coating of synthetic material 4 which surrounds the layer 3 and a part of the conductors 2$b$.

In the beginning of the manufacturing process of the unit B a ceramic bead 9 is soldered to the conductor 2$b$ before securing the active elements 7 and 8. FIGURE 1, which shows the finished device, shows that the said bead serves as a thermal insulator in manufacturing the soldering joint 6$b$ which assembles the two units to one assembly, and that the said insulation, together with that resulting from the length of the conductor 2, is sufficient to prevent the semiconductor junctions of the elements 7 and 8 from being damaged.

A method will now be described, by way of example, of manufacturing a silicon diode for high voltage which comprises two crystals in series doped by means of diffusion for a cut-off voltage of 1500 volts with cut-off currents of less than 50 nanoamperes at a temperature of 25° C.

The ceramic material chosen for manufacturing the envelope 11 shown in FIGURE 4 is a high-grade material having an aluminum oxide content of at least 93% which can be provided with a metal layer according to known methods. Said ceramic material is cleaned by means of nitric acid, rinsed in an ultrasonic bath and baked in air at 1000° C. for 15 minutes. In the embodiment described the dimensions of the envelope are: length 5 mms., outside diameter 2.4 mms., inside diameter 1.65 mms.

The two ends 11$a$ and 11$b$ of the ceramic cylinder are silver-plated (FIG. 4) over a height of 0.5 mm., for example, by dipping in a solution which is commercially available under the tradename "Argent à polir" 242 L. The cylinder is then baked in air at 840° C. for two hours. The silver layer is then coated by electro-deposition with a layer of nickel, 1 or 2$\mu$ thick which reinforces the silver layer and protects it during soldering. Then a layer of gold, 0.1$\mu$ thick, is provided, for example, by electro-deposition, for purposes of facilitating soldering.

That triple layer may be replaced, for example, by a layer of molybdenum-manganese on which a layer of nickel is applied by means of the "Brenner method." In this case it is not necessary to apply a layer of gold because the pressure of phosphorus in the nickel deposited according to the said method facilitates soldering.

The stopper 1 consists of a known nickel-iron alloy having a nickel content of, for example, 42% the composition of which is not critical because soft solder is used. Said stopper, the plate 1$a$ of which has a thickness of 0.65 mm., is coated by deposition which a layer of gold, 0.1 to 0.2/$\mu$ thick, which is diffused in a nitrogen atmosphere at a temperature of 350° C. for 30 minutes.

A molybdenum wafer 12, 50 to 100 microns thick, is coated on the surface 12$a$, which is to be soldered to the plate of the stopper 1, with a layer of gold, 0.1 micron thick, while the surface 12$b$ remains bare.

The envelope 11, the stopper 1, and the wafer 12 are secured together in one soldering operation with a lead-tin solder having a lead content of 37%, which composition has an eutectic temperature of 380° C. This solder joins the stopper on one side with the gold-plated metal layer 11$a$ of the ceramic envelope and, on the other side, with the gold plated surface 12$a$ of the wafer 12 which is wetted immediately. The non-gold-plated surface 12$b$ of the said wafer on the contrary is not wetted by the solder. Thus the said surface remains entirely smooth; this smoothness consequently is the reason of the presence of the molybdenum wafer 12. Because solder always has an irregular flow on a surface, the surface of the stopper 1 in the absence of the wafer 12 would not be smooth so that the flexible member 5 would have to operate under bad conditions since it would not engage a flat, hard and smooth surface.

For making the soldering joint 6$a$ the units are mounted in a suitable holder after which a ring of solder is applied and the assembly is heated in air by means of high-frequency heating. This heating is to be preferred owing to its speed because a comparatively long soldering time might destroy the layer of silver.

Figure 6A:
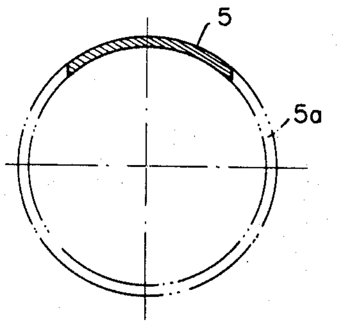
Figure 6C:
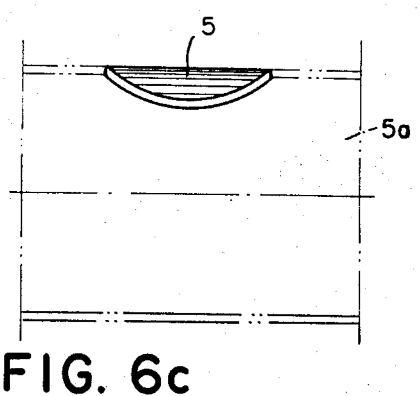
Figure 6B:
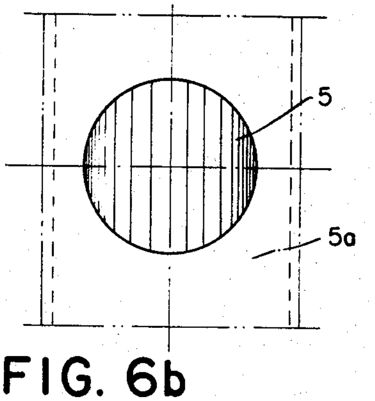

FIGURE 2 shows the flexible member 5 although this is arranged only during assembling. In a preferred embodiment said flexible member which is shown in FIGURES 6$a$ and 6$c$ is a circular piece of material which is punched from a curved tape 5$a$. It preferably consists of phosphorus-bronze, 15 to 20 microns thick. Other resilient alloys also, for example, chromium-nickel, may be used.

The unit B is mounted by starting from the crystal support 2 which, as the stopper 1, consists of a nickel-iron alloy.

For the bead 9 any normal ceramic material may be used provided that it can be provided with a metal layer according to any known method. In a preferred embodiment the bead is entirely coated with a metal layer 9$a$ (shown only in FIG. 3) by dipping in lithium molybdate. For this purpose the ceramic bead is first etched in nitric acid, then rinsed, and finally baked in air at 1000° C. The solution used is a known lithium molybdate solution in water or alcohol. The bead is then baked in a moist hydrogen atmosphere and then in a dry hydrogen atmosphere at 1225° C.

The ceramic bead thus obtained is secured to the conductor 2 by a hard-soldering operation with a silver-copper solder (71% of silver and 29% of copper) 9$b$ (shown only in FIG. 3) having an eutectic temperature of 778° C. For this purpose the assembly of the support and the bead is placed in a suitable jig with a ring of solder. The assembly is heated at 850° C. for a few minutes in a furnace having a hydrogen atmosphere; the assembly consisting of the crystal support and the bead is then coated by deposition with a layer of gold, 0.1 to 0.5 microns thick, and finally baked in a nitrogen atmosphere at 250° C. for 30 minutes. Owing to the said layer of gold the resulting assembly can withstand without corrosion the etching baths which are used after providing the active semiconductor elements 7 and 8.

The following operation comprises on the one hand the simultaneous soldering of the active elements 7 and 8 together and to the wafer 2$a$ of the crystal support and, on the other hand, the soldering of the resulting assembly to the contact and supporting plate 13, i.e. the simultaneous effecting of the soldering joints 10, 14 and 15. The plate 13, 100 microns thick, preferably consists of molybdenum and is coated on both sides with a layer of gold.

The use of molybdenum is obvious on the basis of its coefficient of expansion which is approximately equal to that of silicon.

The resulting assembly is placed in a suitable jig. The solder used is a silver-tin solder containing 5% of silver which melts at 221–225° C. This operation is carried out in a furnace having a mixed-gas atmosphere at a temperature of 350° C. for approximately 1 minute.

After cooling the unit is cleaned in a solution of hydrofluoric acid and then etched, for example, in a soda solution at 104° C. The unit is then rinsed and dried in a nitrogen atmosphere at 120° for 1 hour.

The unit B is completed by providing the active elements 7 and 8 and the wafer 2*a* with a layer of lacquer in the manner shown. For this purpose preferably a lacquer on the basis of silicones is used, for example, the lacquer commercially available under the name "S.I. 996" which is polymerised by baking in a nitrogen atmosphere at 170° C. for 16 hours. The protection is completed by encapsulating the lacquered components and the part of the conductor 2*b* which adjoins the wafer 2*a* with a polymerisable substance, for example that which is known under the name "Rhodorsil XCAF." Polymerisation is then effected at 25° C. in moist air (degree of humidity 80%) after which drying is effected at 120° C. for one hour.

In the ultimate assembly the flexible member 5 is laid on wafer 12 of the unit A, the unit B is then inserted in the unit A, the plate 13 being forced on the flexible member 5 and the bead 9 ensuring the centering.

At the instant of soldering pressure is exerted on the unit B by means of a weight of the order of 20 gs. as a result of which the flexible member is forced to a nearly flat shape. It is ensured that the bead 9 projects outside the envelope 11 over a small distance, the soldering ring being provided so as to envelope the projecting upper part of the bead.

Like the solder 6*a*, the solder 6*b* is a lead-tin solder containing 40% of lead which is heated by high-frequency heating. The operation lasts 1½ to 2 seconds.

Naturally, the invention may be applied to all semiconductor devices including a high voltage electrode.

It may further be used in semiconductor devices for low or medium voltage in which case certain simplifications may be used; for example, the envelope 11 may consist of a metal pipe having thin walls and a poor heat conductivity, for example the same nickel-iron alloy as the stopper 1, the heat insulation while providing the soldering joint 6*b* being effected principally by the ceramic bead 9. In this case the envelope 11 may advantageously be manufactured by deep-drawing so that it consists of a pipe closed at the lower end, the wafer 12 and the flexible member 5 being successively placed on the bottom. The second contact of a diode manufactured by means of the said envelope may consist of the pipe through a connection wire soldered thereto, an insulating sheath, for example, a synthetic material, protecting the body of the pipe.

What is claimed is:

1. A semiconductor device comprising a hermetically-sealed envelope having an electrically conductive first end wall portion, a first conductive lead secured to said first end portion and extending externally of said envelope, a resilient electrically conductive member within the envelope and abutting and contacting said first end wall portion, a second conductive lead extending out the opposite end of said envelope, an insulating bead surrounding said second conductive lead and extending at least partially within the envelope, said insulating bead being of ceramic material and having a longitudinal dimension measured in the direction of the second conductive lead that is larger than its transverse dimension, a coating of lithium molybdate on said insulating bead, hard-solder means securing the coated bead to said second conductive lead, a semiconductive crystal within the envelope and mounted at one side on the end of said second lead and being electrically connected thereto, conductive means on the opposite side of the crystal, said last-named conductive means bearing against said resilient member and electrically contacting same, said resilient member being unbonded to at least one of the last-named conductive means and the first end wall portion and being in a flexibly stressed condition, and solder means securing an annular outside region of said insulating bead to the envelope at its opposite end to hermetically seal-off the envelope.

2. A semiconductor device as set forth in claim 1 wherein the resilient member comprises a curved plate of resilient metal with a circular periphery, and the plate is seated freely on the first end wall portion with its concave portion facing downwardly.

3. A semiconductor device comprising a hermetically-sealed envelope comprising a tubular ceramic member containing at least 93% aluminum oxide, an electrically conductive first end wall portion of said envelope comprising a metal disc integral with a first conductive lead extending externally of said envelope, solder means bonding the metal disc to one end of the ceramic envelope in a hermetic manner, a resilient electrically conductive member within the envelope and abutting and contacting said first end wall portion, a second conductive lead extending out the opposite end of said envelope, an insulating bead surrounding and secured to said second conductive lead and extending at least partially within the envelope, a semiconductive crystal within the envelope and mounted at one side on the end of said second lead and being electrically connected thereto, conductive means on the opposite side of the crystal, said last-named conductive means bearing against said resilient member and electrically contacting same, said resilient member being unbonded to at least one of the last-named conductive means and the first end wall portion and being in a flexibly stressed condition, and solder means securing an annular outside region of said insulating head to the tubular ceramic member at its opposite end to hermetically seal-off the envelope.

4. A device as set forth in claim 3 wherein the insulating bead has a longitudinal dimension in the direction of the second conductive lead that is larger than its transverse dimension, and hard-solder means are employed to secure the insulating bead to the second conductive lead.

References Cited

UNITED STATES PATENTS

| | | | |
|---|---|---|---|
| 2,486,482 | 11/1949 | Brie | 317—234 |
| 2,799,814 | 7/1957 | Schwartz et al. | 317—234 |
| 2,956,214 | 10/1960 | Herbst | 317—234 |
| 3,034,079 | 5/1962 | Uhlir | 317—234 |
| 3,081,374 | 3/1963 | Burch | 174—52.6 |
| 3,107,756 | 10/1963 | Gallet | 317—234 |
| 3,189,799 | 6/1965 | Moroney | 317—234 |
| 3,287,609 | 11/1966 | Bennett et al. | 317—234 |

JOHN W. HUCKERT, *Primary Examiner.*

JERRY D. CRAIG, *Assistant Examiner.*

U.S. Cl. X.R.

174—52

UNITED STATES PATENT OFFICE
CERTIFICATE OF CORRECTION

Patent No. 3,419,762 December 31, 1968

Louis Lucas

It is certified that error appears in the above identified patent and that said Letters Patent are hereby corrected as shown below:

Column 2, line 43, after "thermal" insert a comma; line 53, after "diode" insert -- for high voltage according to the invention. --; line 62, cancel "for high voltage according to the invention --. Column 4, line 1, "presence" should read -- pressure --; line 8, "0.2/" should read -- 0.2 --. Column 5, line 63, "a" should read -- of --. Column 6, line 48, "head" should read -- bead --.

Signed and sealed this 24th day of March 1970.

(SEAL)
Attest:

Edward M. Fletcher, Jr.
Attesting Officer

WILLIAM E. SCHUYLER, JR.
Commissioner of Patents